(12) United States Patent
Yoo et al.

(10) Patent No.: US 11,326,258 B2
(45) Date of Patent: May 10, 2022

(54) DEPOSITION MASK AND METHOD OF MANUFACTURING THE SAME

(71) Applicant: LG DISPLAY CO., LTD., Seoul (KR)

(72) Inventors: MyungJae Yoo, Paju-si (KR); HyunTaek Lim, Paju-si (KR); Huiseong Yu, Paju-si (KR); Joohwan Hwang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 115 days.

(21) Appl. No.: 15/668,982

(22) Filed: Aug. 4, 2017

(65) Prior Publication Data

US 2018/0148844 A1    May 31, 2018

(30) Foreign Application Priority Data

Nov. 30, 2016    (KR) .................. 10-2016-0161160

(51) Int. Cl.
| | | |
|---|---|---|
| *C23C 18/16* | (2006.01) | |
| *C25D 1/10* | (2006.01) | |
| *H01L 51/00* | (2006.01) | |
| *B23K 26/244* | (2014.01) | |
| *B23K 26/28* | (2014.01) | |
| *B23K 26/32* | (2014.01) | |

(52) U.S. Cl.
CPC ........ *C23C 18/1633* (2013.01); *B23K 26/244* (2015.10); *B23K 26/28* (2013.01); *B23K 26/32* (2013.01); *C23C 18/161* (2013.01); *C23C 18/1605* (2013.01); *C25D 1/10* (2013.01); *H01L 51/0004* (2013.01); *H01L 51/0011* (2013.01)

(58) Field of Classification Search
CPC ..... C25D 1/10; C23C 18/1605; C23C 18/161; H01L 51/0011; H01L 51/0004
See application file for complete search history.

(56) References Cited

U.S. PATENT DOCUMENTS

2005/0115503 A1*  6/2005  Hagiwara ............. C23C 14/042
                                                     118/721
2006/0012290 A1*  1/2006  Kang .................. H01L 27/3211
                                                     313/504

(Continued)

FOREIGN PATENT DOCUMENTS

| CN | 100481577 C | 4/2009 |
|---|---|---|
| CN | 102569673 A | 7/2012 |

(Continued)

OTHER PUBLICATIONS

Office Action dated Jul. 2, 2019 issued in the corresponding Chinese Patent Application No. 201710564283.6 (20 Pages).

*Primary Examiner* — George R Koch
*Assistant Examiner* — Christopher C Caillouet
(74) *Attorney, Agent, or Firm* — Polsinelli PC

(57) ABSTRACT

The present disclosures provide a deposition mask and a method of manufacturing the same. The disclosed deposition mask may include: a deposition portion including a plurality of deposition patterns; and a boundary portion surrounding the deposition portion and including a first region and a second region extending from the first region. The boundary portion may have a thickness thicker than that of the deposition portion. Through this, it is possible to prevent a thermal deformation of the mask which may occur when the mask and mask frame are welded to each other.

8 Claims, 17 Drawing Sheets

(56) References Cited

U.S. PATENT DOCUMENTS

| | | | |
|---|---|---|---|
| 2010/0267227 A1* | 10/2010 | Ko | B05C 11/00 |
| | | | 438/597 |
| 2012/0156812 A1* | 6/2012 | Ko | C23C 14/042 |
| | | | 438/22 |
| 2016/0260935 A1 | 9/2016 | Lee | |
| 2018/0248120 A1* | 8/2018 | Zhang | C23C 14/24 |

FOREIGN PATENT DOCUMENTS

| | | |
|---|---|---|
| CN | 104372292 A | 2/2015 |
| CN | 105102668 A | 11/2015 |
| KR | 2012-0069396 A | 6/2012 |

\* cited by examiner

DEPOSITION MASK AND METHOD OF MANUFACTURING THE SAME

CROSS-REFERENCE TO RELATED APPLICATION

This application claims priority from Korean Patent Application No. 10-2016-0161160, filed on Nov. 30, 2016, which is hereby incorporated by reference in its entirety for all purposes as if fully set forth herein.

BACKGROUND

Field of the Disclosure

The present disclosure relates to a manufacturing apparatus for a display device, and more particularly, to a deposition mask and a method of manufacturing the same.

Description of the Related Art

In accordance with the development of the information-oriented society, the development of a new image display device that improves defects, such as heavy weight and large volume of a conventional cathode ray tube (CRT), has been demanded. Accordingly, various flat panel display devices, such as a liquid crystal display (LCD) device, an organic light emitting diode display (OLED) device, a plasma display panel (PDP) device, and a surface-conduction electronemitter display (SED) device, are drawing attention.

Such a display device includes at least one substrate and a plurality of fine patterns are disposed on the substrate. A deposition process using a mask is required in order to form such a fine pattern.

Generally, the mask used in the deposition process is used as a mask assembly including a mask and a mask frame welded to one side of the mask. Due to the thin thickness (10 μm) of such a mask, the mask may be fractured during the process of welding the mask to the mask frame so that there is a difficulty in joining the mask to the mask frame. Furthermore, due to the thin thickness of the mask, a thermal deformation of the mask may occur in a region where a laser is irradiated during the process of welding the mask to the mask frame using a laser. Due to the thermal deformation of the mask, a deposition portion of the mask and a deposition pattern portion may be deformed so that deposition accuracy can be degraded. In addition, due to the thermal deformation of the mask, a gap can occur between the mask and the substrate to be deposited, thereby causing a shadow effect.

Therefore, a mask capable of solving the above-mentioned problems is needed.

SUMMARY

Accordingly, the present disclosure is directed to a deposition mask and a method of manufacturing the same, that substantially obviate one or more problems due to limitations and disadvantages of the prior art.

More specifically, the present disclosure is to solve such problems, such as failure and thermal deformation of the mask, which can occur in the course of welding the mask to the mask frame.

According to an aspect, a deposition mask includes a deposition portion including a plurality of deposition patterns. In addition, the deposition mask includes a boundary portion surrounding the outside of the deposition portion and including a first region and a second region extending from the first region. In addition, in the deposition mask, the thickness of the boundary portion may be thicker than the thickness of the deposition portion.

In addition, according to another aspect, a method of manufacturing a deposition mask includes forming a plurality of patterning electrodes on a substrate. In addition, the method of manufacturing a deposition mask includes forming a reversely tapered photoresist pattern on a substrate on which a plurality of patterning electrodes are not arranged. In addition, the method of manufacturing a deposition mask includes primarily plating of a mask material only on a patterning electrode arranged on the outer periphery of the substrate. In addition, the method of manufacturing a deposition mask includes secondarily plating the mask material on the patterning electrode arranged on the outer periphery of the substrate and the remaining patterning electrodes.

Further, according to another aspect, the method of manufacturing a deposition mask includes welding a mask frame to one surface of the mask material formed on the outer periphery of the substrate. Further, the method of manufacturing a deposition mask includes removing the substrate and the patterning electrode.

In embodiment further aspect of the present disclosure, a method of depositing a material on a substrate using a deposition mask including a deposition portion including a plurality of deposition patterns, and a boundary portion surrounding the deposition portion and including a first region and a second region extending from the first region, wherein the boundary portion has a thickness that is thicker than that of the deposition portion, the method comprising: disposing the deposition mask on one side of the substrate; and performing a depositing process such that the material is deposited on the substrate through the deposition mask.

A deposition mask and a method of manufacturing the same according to the present disclosure is capable of preventing the mask from being thermally deformed when welding the mask to a mask frame by making the thickness of the boundary portion of the mask thicker than the thickness of the deposition portion of the mask.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the present disclosure and together with the description serve to explain the principle of the disclosure.

In the drawings.

DETAILED DESCRIPTION

Figure 1:
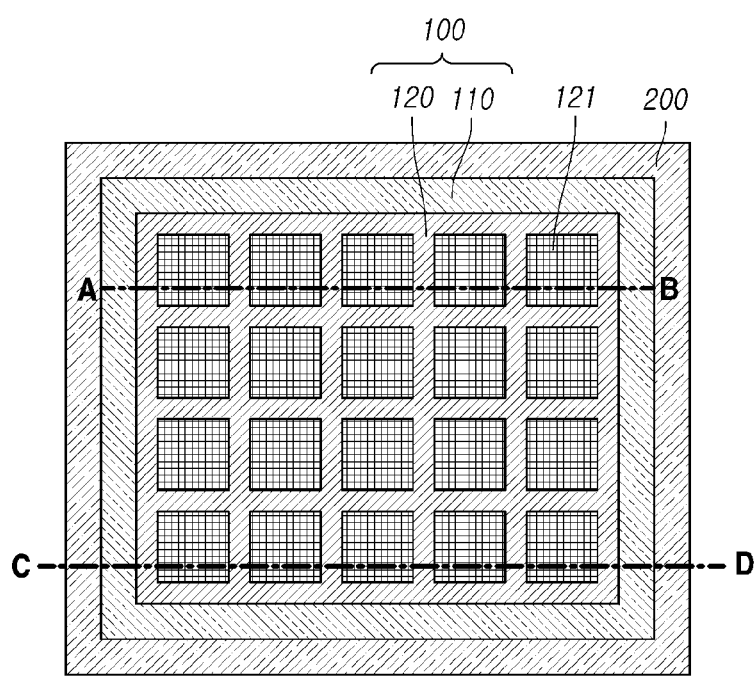
FIG. 1 is a plan view schematically illustrating a mask and a mask frame according to the present disclosure.

Hereinafter, the present disclosure will be described in detail with reference to the accompanying drawings. The following aspects are provided, by way of example, so that the idea of the present disclosure can be sufficiently transferred to those skilled in the art. Therefore, the present disclosure is not limited to the aspects as described below, and may be embodied in other forms. Also, in the drawings, the size, thickness, and the like of a device may be exaggeratedly represented for the convenience of description. Throughout the specification, the same reference numerals designate the same elements.

The advantages and features of the present disclosure and methods of achieving the same will be apparent by referring to aspects of the present disclosure as described below in detail in conjunction with the accompanying drawings. However, the present disclosure is not limited to the aspects set forth below, but may be implemented in various different forms. The following aspects are provided only to completely disclose the present disclosure and inform those skilled in the art of the scope of the present disclosure, and the present disclosure is defined only by the scope of the appended claims. Throughout the specification, the same or like reference numerals designate the same or like elements. In the drawings, the dimensions and relative sizes of layers and regions may be exaggerated for the convenience of description.

When an element or layer is disposed "on" another element or layer, another layer or another element may be interposed directly on the other element or therebetween. In contrast, when an element is referred to as being "immediately on" or "directly on," no intervening elements or layers may be present.

The spatially-relative terms such as "below," "beneath," "lower," "above," and "upper" may be used herein for ease of description to describe the relationship of one element or components with another element(s) or component(s) as illustrated in the drawings. The spatially relative term should be understood to include different directions of the element which is used or operates, in addition to the direction illustrated in the drawing. For example, if the element in the drawings is turned over, elements described as "below" or "beneath" other elements would then be oriented "above" the other elements. Therefore, an exemplary term "below" may encompass both an orientation of above and below.

FIG. 1 is a plan view schematically illustrating a mask and a mask frame according to of the present disclosure. Referring to FIG. 1, a mask 100 according to the present disclosure includes a boundary portion 110 and a deposition portion 120. At this time, the boundary portion 110 is arranged to surround the outer periphery of the deposition portion 120. In addition, the deposition portion 120 includes a plurality of deposition pattern portions 121. The plurality of deposition pattern portions 121 may be arranged to be spaced apart from each other in the deposition portion 120.

A mask frame 200 is provided outside the mask 100. The mask frame 200 may be combined with the mask 100, and may serve to support the mask 100. The mask frame 200 may be made of a metal, a synthetic resin, or the like. The mask frame 200 may have a rectangular shape, and may be provided with one or more openings.

However, while FIG. 1 illustrates a configuration in which the shape of the mask frame 200 has a rectangular shape, the shape of the mask frame 200 according to the aspects is not limited thereto, and may be formed in various shapes, such as a circular shape and a hexagonal shape.

Meanwhile, the deposition portion 120 of the mask 100 may be arranged in a region corresponding to the openings of the mask frame 200. A deposited material that has passed through the openings of the mask frame 200 may be deposited on the substrate through the deposition pattern portions 121 of the mask 100.

FIG. 1 illustrates a configuration in which the deposition pattern portions 121 include a masking pattern having a plurality of slits. However, it will be understood by a person ordinarily skilled in the art that the deposition pattern portions 121 according to the aspects of the disclosure are not limited thereto, and various modifications can be made. That is, each deposition pattern portion 121 may be provided with a masking pattern that maintains the entirely opened state, or a dot-shaped masking pattern. The number, arrangement position, and shape of the deposition pattern portions 121 in FIG. 1 are illustrated merely as an example, and the aspects of the present disclosure are not limited thereto.

Generally, the metal mask 100 is manufactured through an electroforming method. Now, a method of fabricating a mask using an electroforming method is briefly described. A patterning electrode is formed on a glass substrate. Then, a photoresist is formed in a region where no electrode is formed.

Thereafter, the glass substrate provided with a metal electrode (i.e., anode) and the patterning electrode (i.e., cathodes) is immersed into an electrolyte, and then a current is applied thereto. Through this, metal is plated on the patterning electrode on the glass substrate so that a metal mask can be fabricated. The fabricated metal mask is welded to the mask frame using a laser. Thereafter, the glass substrate is removed so that a mask welded to the mask frame can be formed.

Meanwhile, due to the thin thickness (e.g., about 10 μm) of the mask formed by the above-described method, the mask is broken during the process of welding the mask to the mask frame using a laser, which makes it difficult to join the mask to the mask frame. In addition, due to the thin thickness of the mask, a thermal deformation of the mask may occur in the region where the laser is irradiated during the process of welding the mask to the mask frame using the laser. Due to the thermal deformation of the mask, a deposition portion of the mask and a deposition pattern portion may be deformed so that deposition accuracy may be degraded.

In addition, due to the thermal deformation of the mask, a gap can occur between the mask and the substrate to be deposited, thereby causing a shadow effect. The shadow effect refers to a phenomenon in which a distance between the mask 100 and the substrate on which the material is deposited through the mask 100 increases, so that the material is deposited to a region other than a desired region.

The mask 100 according to an aspect of the present disclosure solves such a problem, and the boundary portion 110 and the deposition portion 120 to be irradiated with the laser in the mask 100 may be formed to have different thicknesses. This configuration will be described below with reference to FIG. 2.

Figure 2:
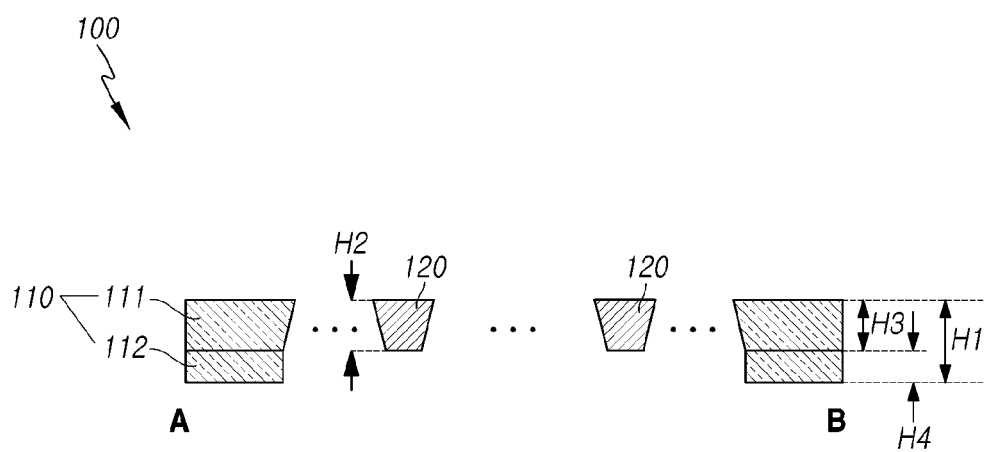
FIG. 2 is a cross-sectional view taken along line A-B in FIG. 1.

FIG. 2 is a cross-sectional view taken along line A-B in FIG. 1. Referring to FIG. 2, a mask 100 according to an aspect of the present disclosure includes a boundary portion 110 and a deposition portion 120.

The thickness H1 of the boundary portion 110 of the mask 100 may be different from the thickness H2 of the deposition portion 120. Specifically, the thickness H1 of the boundary portion 110 of the mask 100 may be thicker than the thickness H2 of the deposition portion 120. Meanwhile, the boundary portion 110 refers to a region arranged to surround the deposition portion 120, and may be a region including a region irradiated with a laser when a mask frame (not illustrated) is welded thereto.

As illustrated in FIG. 2, the thickness H1 of the boundary portion 110 including the region irradiated with the laser is made to be thicker than the thickness H2 of the deposition portion 120, so that it prevents the mask from being broken or thermally deformed even if the boundary portion 110 is radiated with the laser.

As described above, the thickness H1 of the boundary portion 110 of the mask 100 may be thicker than the thickness H2 of the deposition portion 120 as described above. This configuration will be described in detail below.

The boundary portion 110 of the mask 100 may include a first region 111 and a second region 112 extending to the first region 111. In this case, the thickness H3 of the first region 111 of the boundary portion 110 may be equal to the thickness H2 of the deposition portion 120. That is, since the boundary portion 110 includes the first region 111 having the thickness being equal to that of the deposition portion 120 and the second region 112 extending from the first region 111, the thickness H1 of the boundary portion 110 may be thicker than the thickness of the deposition portion 120 by the thickness H4 of the second region 112 of the boundary portion 110.

Since the thickness of the boundary portion 110 including the region irradiated with the laser is thicker than the thickness of the deposition portion 120, the boundary portion 110 of the mask 100 can be prevented from being thermally deformed even when the mask 100 and the mask frame are welded to each other.

While FIG. 2 illustrates a configuration in which the thickness H3 of the first region 111 of the boundary portion 110 and the thickness of the deposition portion 120 are the same, the aspects of the disclosure are not limited to this, and may include a configuration in which the thickness H3 of the first region 111 of the boundary portion 110 may be thicker than the thickness of the deposition portion 120.

That is, the thickness H3 of the first region 111 of the boundary portion 110 may be equal to or larger than the thickness H2 of the deposition portion 120. Therefore, the total thickness H1 of the boundary portion 110 may be thicker than the thickness of the deposition portion 120.

Figure 3:
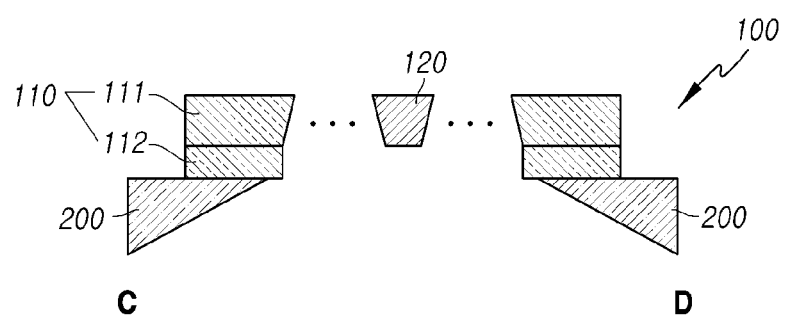
FIG. 3 is a cross-sectional view taken along line C-D of FIG. 1.

The mask 100 as described above may be welded to a mask frame using a laser. This will be described with reference to FIG. 3. FIG. 3 is a cross-sectional view taken along line C-D of FIG. 1.

Referring to FIG. 3, the mask 100 and the mask frame 200 according to an aspect of the disclosure may be joined to each other through a laser welding. Specifically, one side of the mask frame 200 may be joined to a portion of the second region 112 of the boundary portion 110 of the mask 100. When the mask frame 200 is joined to the boundary portion 110 of the mask 100 in this way, the mask frame 200 is capable of supporting the mask 100.

While FIG. 3 illustrates a configuration in which the cross section of the mask frame 200 is a right triangle, the aspect of the disclosure is not limited to this, and the mask frame 200 may have various shapes.

In order to weld the mask 100 to the mask frame 200 as described above, a welding line is required. In the process of joining the mask 100 and the mask frame 200 to each other, a laser may be irradiated along a welding line 300 (shown in FIG. 3). Although a configuration in which a laser is irradiated along the welding line 300 is described as an example, the aspect of the disclosures not limited thereto, and various methods, such as pressurization, plasma treatment, heating type welding treatment, may be used along the welding line. Hereinafter, for the convenience of description, a description will be given mainly of a method in which a laser is irradiated along a welding line in the process of joining the mask 100 and the mask frame 200 to each other.

This will be described below with reference to FIGS. 4 to 9.

Figure 4:
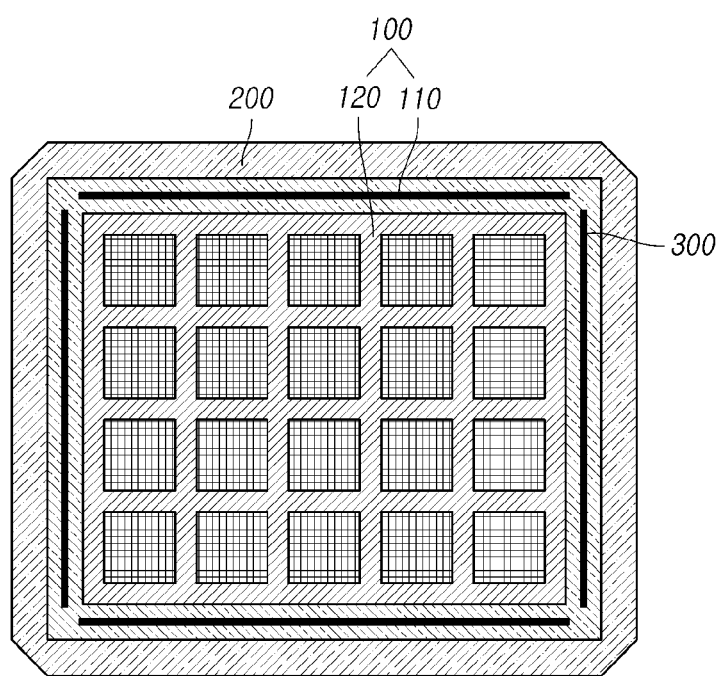
FIG. 4 is a view illustrating a welding line according to a first aspect.

FIG. 4 is a view illustrating a welding line according to a first aspect of the disclosure. Referring to FIG. 4, the welding line 300 according to the first aspect may be provided in the boundary portion 110 of the mask 100. Specifically, the welding line 300 may be provided in the first region of the boundary portion 110.

Meanwhile, the welding line 300 according to the first aspect may have a line shape surrounding the deposition portion 120 in the boundary portion 110 of the in a rectangular frame shape. At this time, the welding line 300 according to the first aspect may not be disposed in a region corresponding to corners of the boundary portion 110 of the mask 100. In other words, the welding line 300 may be provided in a rectangular frame shape in the boundary portion 110 of the mask 100, and may be opened at the regions corresponding to the corners of the boundary portion 110.

Since the welding line 300 according to the first aspect is formed in the rectangular frame shape in which the regions corresponding to the corners of the boundary portions 110 are opened as described above, the mask 100 and the mask frame 200 can be easily welded using a pulsed laser.

Meanwhile, when fabricating the mask 100, the mask 100 is formed on a glass substrate using an electroforming method, and the mask 100 and the mask frame 200 are welded to each other before the glass substrate and the mask 100 are separated from each other. The electroforming method enables the depth and the precision of a mask opening to be easily controlled. In this case, when a glass substrate is disposed in the region corresponding to a corner of the boundary portion 110 of the mask, the region corresponding to the corner of the boundary portion 110 of the mask 100 shall not be irradiated with a laser in order to prevent the glass substrate from being molten. That is, the mask 100 and the mask frame 200 shall be joined to each other using the welding line 300 according to the first aspect.

In other words, the welding line 300 according to the first aspect may be used when the glass substrate is disposed to cover the regions corresponding to the corners of the boundary portions 110 of the mask 100.

Figure 5:
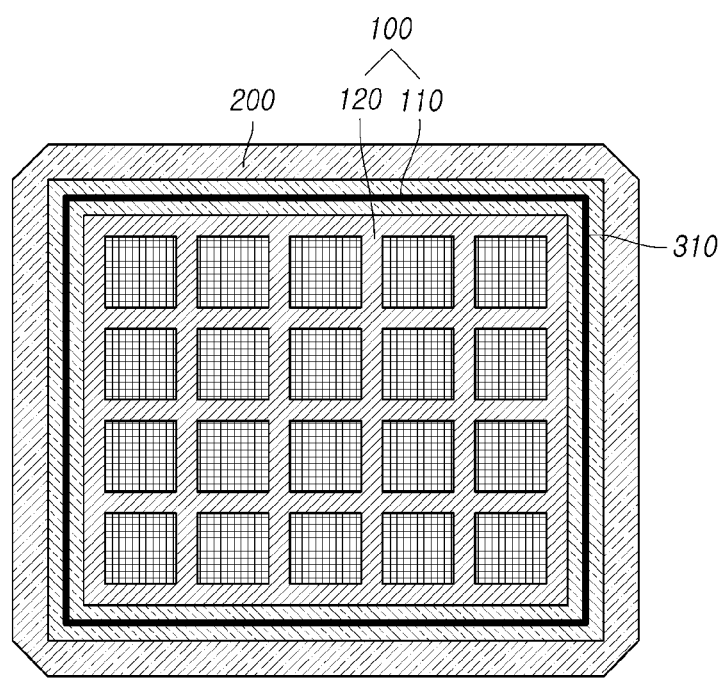
FIG. 5 is a view illustrating a welding line according to a second aspect.

FIG. 5 is a view illustrating a welding line according to a second aspect of the disclosure. Referring to FIG. 5 in comparison with FIG. 4, the welding line 310 according to the second aspect may extend to the regions corresponding to the corners of the boundary portion 110 of the mask 100. That is, the welding line 310 according to the second aspect may be formed in a rectangular frame shape in a portion of the boundary portions 110 of the mask 100.

Since the welding line 310 according to the second aspect is formed in a rectangular frame shape in a portion of the boundary portion 110 of the mask 100 in this way, the boundary portion 110 of the mask 100 can be firmly fixed to the mask frame 200 even at the corner regions.

In addition, since the welding line 310 according to the second aspect has a shape extending even to the regions corresponding to the corners of the boundary portion 110 of the mask 100, the welding line 310 may be used when the glass substrate disposed on one surface of the mask 100 is disposed not to cover the regions corresponding to the corners of the boundary portion 110 of the mask 100.

Figure 6:
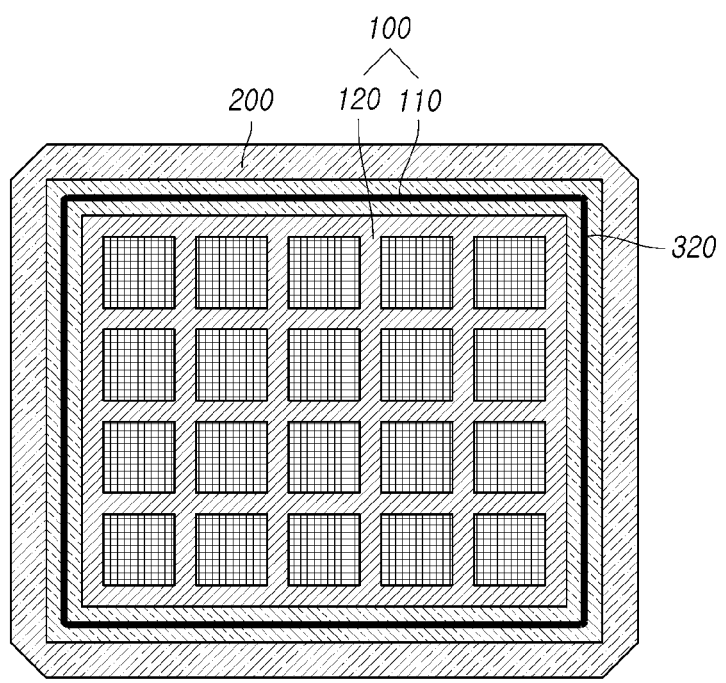
FIG. 6 is a view illustrating a welding line according to a third aspect.

FIG. 6 is a view illustrating a welding line according to a third aspect of the disclosure. Referring to FIG. 6 the welding line 320 is different from that in FIG. 5 in that the welding line 320 is formed in a shape in which the welding line 320 is rounded in the regions corresponding to the corners of the boundary portion 110 of the mask 100.

Since the welding line 320 according to the third aspect is formed in a rounded shape in a portion corresponding to corners of the boundary portion 110 of the mask 100 in this way, the length of the welding line 320 can be increased in the regions corresponding to the boundary portion 110 of the mask 100. Therefore, when welding is performed along the welding line 320 according to the third aspect, the mask 100 and the mask frame 200 are more firmly attached to each other in the region corresponding to the boundary portion 110 of the mask 100.

In addition, since the welding line 320 according to the third aspect has a shape extending to the regions corresponding to the corners of the boundary portions 110 of the mask 100, the welding line 320 may be used when the glass substrate disposed on one surface of the mask 100 is disposed not to cover the regions corresponding to the corners of the boundary portion 110 of the mask 100.

Figure 7:
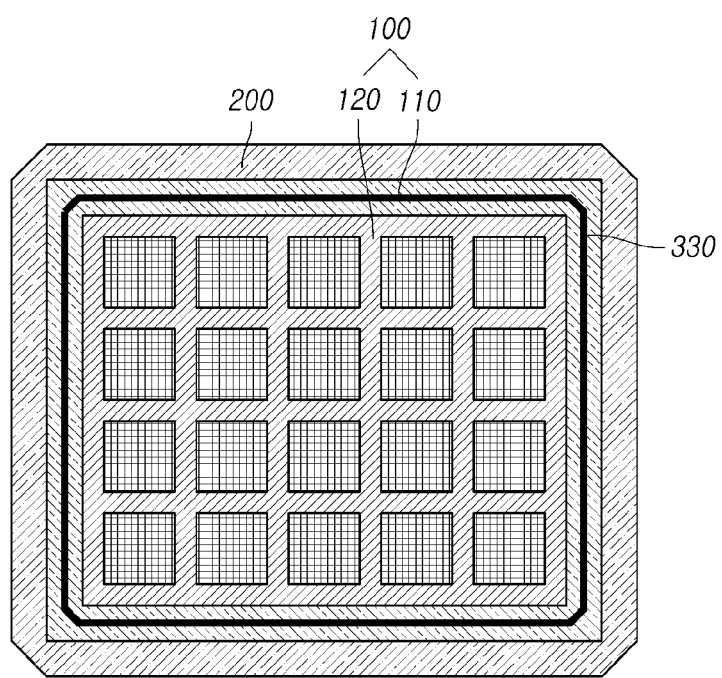
FIG. 7 is a view illustrating a welding line according to a fourth aspect.

FIG. 7 is a view illustrating a welding line according to a fourth aspect of the disclosure. Referring to FIG. 7 in comparison with FIG. 6, the welding line 330 according to the fourth aspect has a shape extending diagonally to the region corresponding to the corners of the boundary portions 110 of the mask 100. This case may also be used when the glass substrate disposed on one side of the mask 100 is not disposed in the regions corresponding to the corners of the boundary portion 110 of the mask 100.

Figure 8:
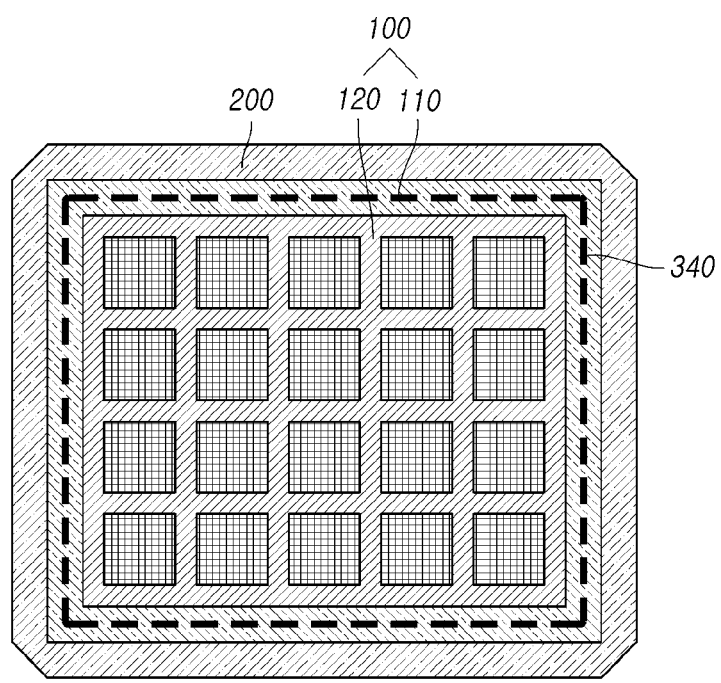
FIG. 8 is a view illustrating a welding line according to a fifth aspect.

FIG. 8 is a view illustrating a welding line according to a fifth aspect. Referring to FIG. 8, the welding line 340 according to the fifth aspect differs from that in FIG. 6 in that the welding line 340 is formed in a dotted line shape rather than in a solid line shape.

Figure 9:
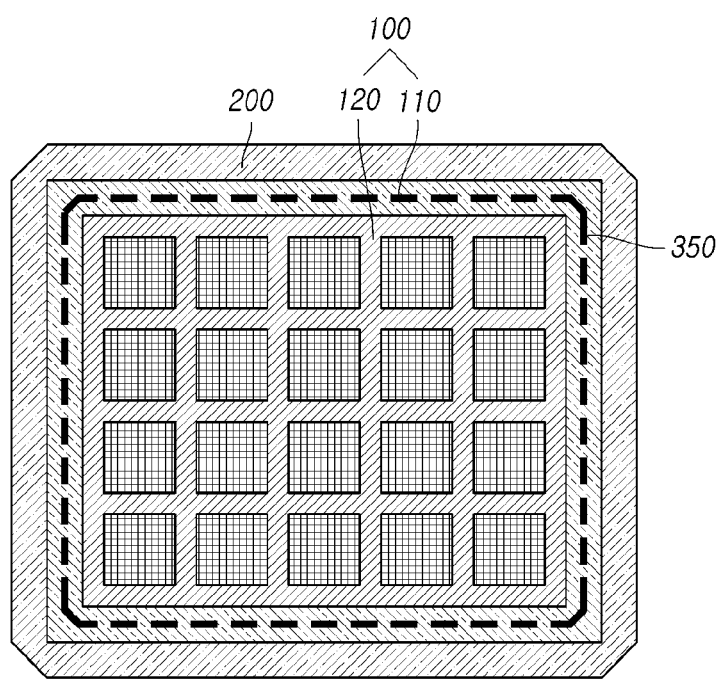
FIG. 9 is a view illustrating a welding line according to a sixth aspect.

In addition, FIG. 9 is a view illustrating a welding line according to a sixth aspect of the disclosure. Referring to FIG. 9, the welding line 350 according to the sixth aspect differs from that in FIG. 7 in that the welding line 350 is formed in a dotted line shape rather than in a solid line shape.

As illustrated in FIGS. 8 and 9, since the welding lines 340 and 350 are formed in a dotted line shape, the mask 100 and the mask frame 200 can be connected to each other using a dot type laser.

As illustrated in FIGS. 5 to 9, the welding lines 300, 310, 320, 330, 340, and 350 may be configured in various shapes. The optimal shape of the welding line 300, 310, 320, 330, 340, or 350 may be determined according to the position of a glass substrate provided on one side of the mask 100. In other words, when the glass substrate is disposed to cover the corners of the boundary portion 110 of the mask 100, the welding line may be cut off in the regions corresponding to the corners of the boundary portion 110 of the mask 100.

In other words, the position of the structure supporting the glass substrate during the welding of the mask 100 and the mask frame 200 may vary according to the size of the glass substrate disposed on one side of the mask 100, and hence the structure of the mask frame 200 may also vary. That is, the position of the structure supporting the glass substrate is changed according to the size of the glass substrate, which may also affect the structure of the mask frame 200.

Therefore, the optimal shape of the welding line 300, 310, 320, 330, 340, or 350 may be determined depending on the structure of the mask frame 200. This means that the shape of the welding line 300, 310, 320, 330, 340, or 350 may also be changed when the structure of the mask frame 200 is changed.

Next, a method of forming the mask 100 and the mask frame 200 according to the present disclosure will be described. FIGS. 10 to 16 are views illustrating a mask forming process and a process of joining a mask frame to the mask according to aspects of the present disclosure.

Figure 10:
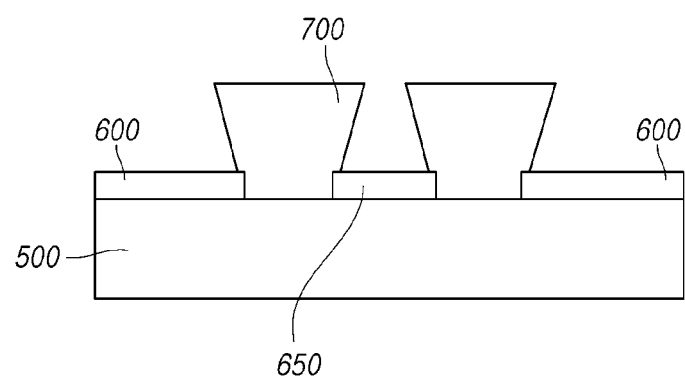
FIGS. 10 to 16 are views schematically illustrating a mask forming process and a process of joining a mask frame to the mask according to the present disclosure.

First, referring to FIG. 10, an electrode material layer is formed on a glass substrate 500, and then the electrode material layer is patterned. Among patterning electrodes 600 and 650, the patterning electrodes 600 disposed on the outer periphery of the glass substrate 500 may be a region corresponding to the boundary portion of the mask, and the remaining patterning electrode 650 other than the patterning electrodes 600 disposed on the outer periphery of the glass substrate 500 may become a region corresponding to the deposition portion of the mask later. Thereafter, a photoresist is applied on the glass substrate 500. Then, the photoresist pattern 700 remains in the regions where the patterning electrodes 600 and 650 are not disposed. At this time, the photoresist pattern 700 provided on the glass substrate 500 may have a reversely tapered shape.

Figure 11:
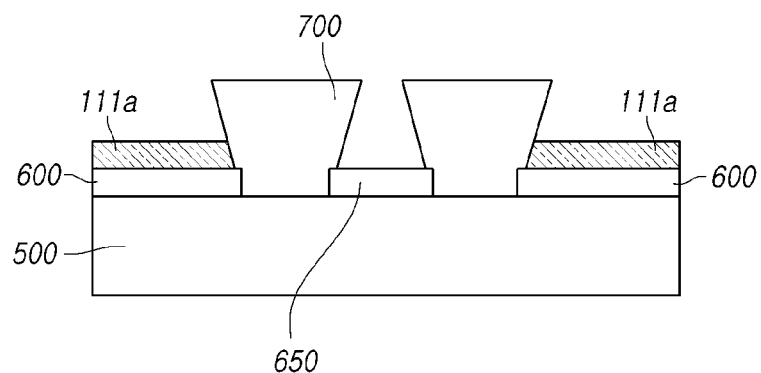

Referring to FIG. 11, a portion of the mask is formed on the patterning electrodes 600 disposed in the outer periphery of the glass substrate 500 by using an electroforming method (hereinafter, referred to as "primary electroforming"). At this time, a portion of the formed mask may be a region corresponding to a portion 111a of the first region of the boundary portion of the mask, which will be formed later. That is, in the primary electroforming process, only a portion of the boundary portion of the mask, which will be formed later, is formed, and a region corresponding to the deposition portion of the mask is not formed.

Subsequently, referring to FIG. 12, the remaining portion of the boundary portion 110 of the mask, which will be formed later using the electroforming method (hereinafter, referred to as "secondary electroforming"), specifically, the remaining portion of the first region 111 of the boundary portion of the mask and the second region 112 of the boundary portion of the mask are formed, and then the deposition portion 120 of the mask is formed.

As described above, the boundary portion of the mask is formed through the primary electroforming process and the secondary electroforming process, and the deposition portion 120 of the mask may be formed only by the secondary electroforming process. That is, since the metal shall not be plated on the patterning electrodes 650 in a region corresponding to the deposition portion 120 of the mask in the primary electroforming process, it is necessary to form a device to apply a current to each of the regions where the deposition portion 120 and the boundary portion 110 of the mask are formed.

Figure 13:
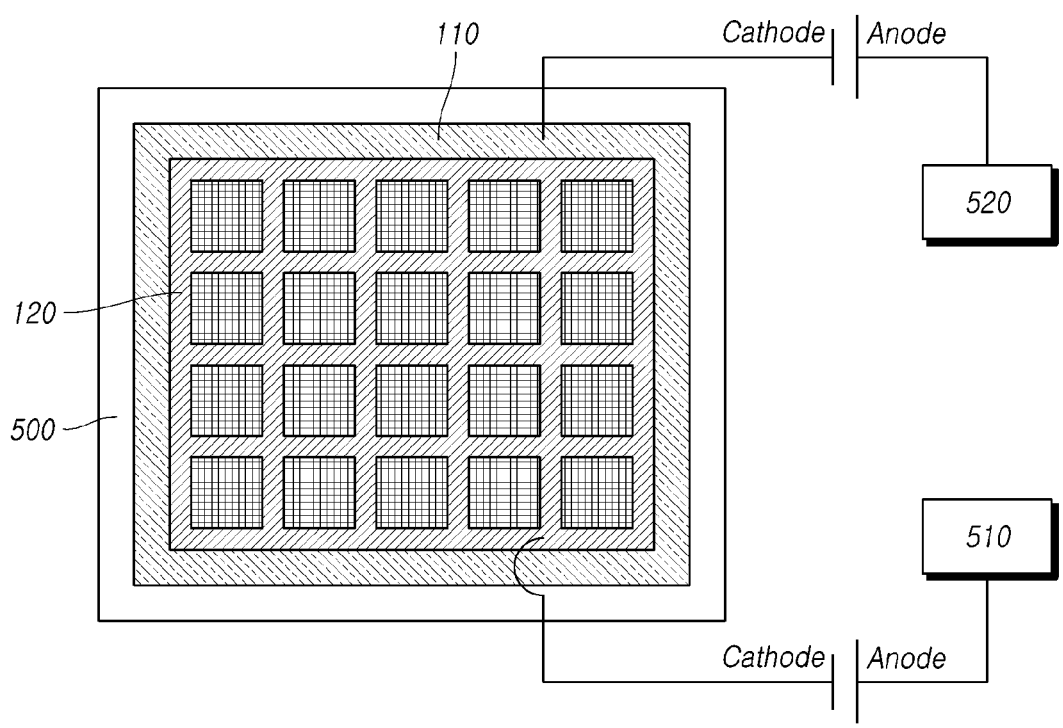

This configuration will be described with reference to FIG. 13. Referring to FIG. 13, a patterned metal 600 (i.e., cathode) disposed in a region corresponding to the boundary portion of the mask is plated with a first metal 520 (i.e., anode). The patterned metal 650 (i.e., cathode) disposed in the region corresponding to the deposition portion of the mask is plated with a second metal 510 (i.e., anode).

At this time, the first metal 520 and the second metal 510 may be formed of at least one of iron, nickel, copper, tin, gold, stainless steel, Invar alloy, Inconel alloy, Covar alloy, an iron alloy, a nickel alloy, a nickel-phosphorous (Ni—P) alloy, and a nickel-phosphorous-polytetrafluoroethylene (Ni—P-PTFE) alloy, but the aspects of the present disclosure are not limited thereto.

Accordingly, the mask may also be formed of at least one of iron, nickel, copper, tin, gold, stainless steel, Invar alloy, Inconel alloy, Covar alloy, an iron alloy, a nickel alloy, a nickel-phosphorous (Ni—P) alloy, and a nickel-phosphorous-polytetrafluoroethylene (Ni—P-PTFE) alloy, but the embodiments are not limited thereto.

Figure 12:
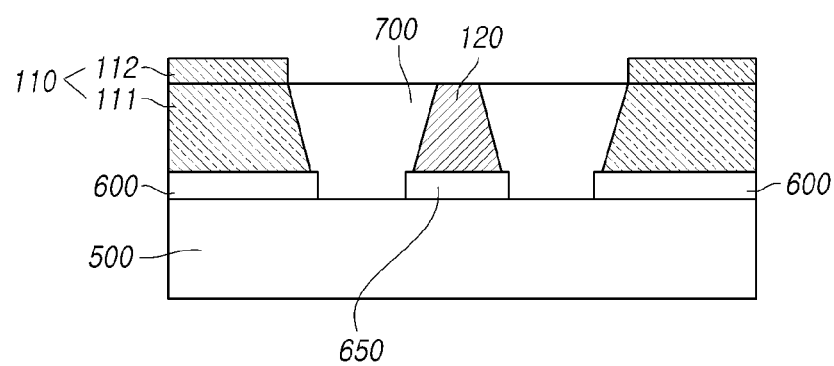

Meanwhile, as illustrated in FIG. 12, the boundary portion of the mask is formed through the primary electroforming process and the secondary electroforming process, and the deposition portion 120 of the mask is formed only by the secondary electroforming process, so that the boundary portion 110 of the mask may be thicker than the thickness of the deposition portion 120 of the mask by the thickness of the region formed in the primary electroforming process.

In addition, the first region 111 of the boundary portion 110 of the mask and the deposition portion 120 of the mask may be inclined on at least one side. Since at least one side of the first region 111 of the boundary portion 110 and the deposition portion 120 of the mask is disposed to be in contact with a reversely tapered photoresist pattern 700, side portions of the first region 111 of the boundary portion 110 and the deposition portion 120 of the mask disposed to be in contact with the photoresist pattern 700 may be formed to have a slope. In this way, the size of an inlet port of the mask through which the deposition material passes can be adjusted.

Figure 14:
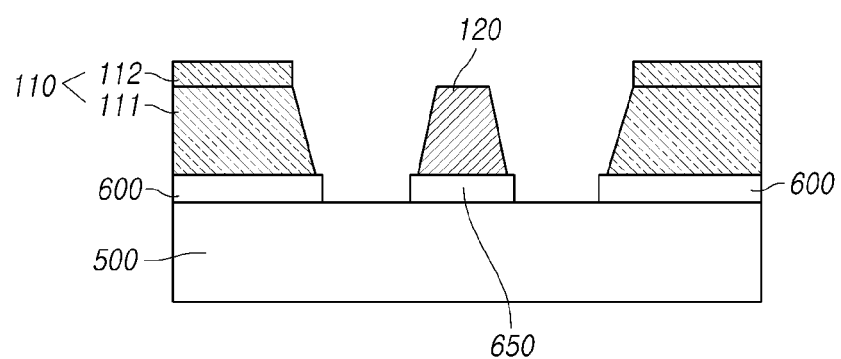

Subsequently, referring to FIG. 14, the photoresist pattern formed on the glass substrate 500 is removed. By removing the photoresist pattern, a portion of the upper surface of the glass substrate 500 can be exposed. At this time, the region where the upper surface of the glass substrate 500 is exposed may be a region corresponding to the inlet port of the mask, which will be formed later.

Figure 15:
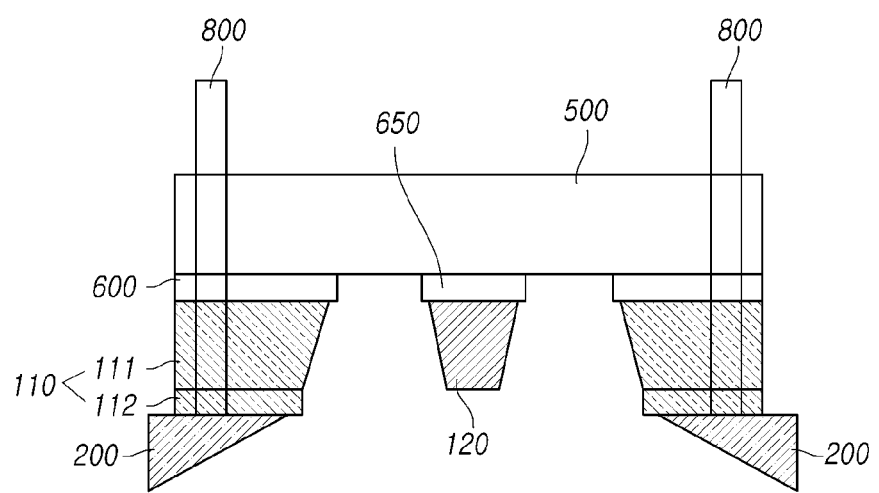

Next, referring to FIG. 15, the mask 100 and the mask frame 200 are welded to each other using a laser 800. At this time, the laser 800 may be irradiated along the welding line formed on the upper surface of the second region 112 (shown in FIG. 14) of the mask 100.

Figure 16:
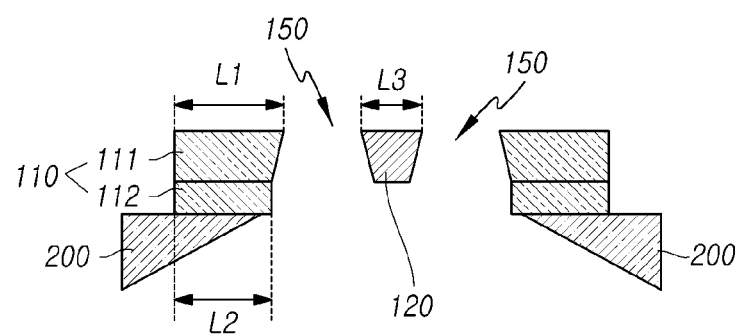

Subsequently, referring to FIG. 16, after the mask 100 and the mask frame 200 are welded to each other, the glass substrate and the patterning electrodes disposed on the glass substrate are removed so as to finally form the mask 100 and the mask frame 200.

The maximum width L1 of the first region 111 of the boundary portion 110 of the finally formed mask 100 may be larger than the maximum width L2 of the second region 112. In addition, the region having the maximum width L3 of the deposition portion 120 between different deposition patterns disposed adjacent to each other or the deposition portion 120 between the deposition pattern portion and the boundary portion 110 may be disposed at the same position as the position where the first region 111 of the boundary portion 110 has the maximum width L1.

A gap between the region having the maximum width L1 of the first region 111 of the boundary portion 110 and the region having the maximum width L3 of the deposition portion 120 is formed as a deposition material inlet port 150, through which a deposited material may be deposited on a substrate (e.g., a TFT substrate or a color filter substrate).

As illustrated in FIGS. 10 to 12, the size of the inlet port 150 of the mask 100 can be adjusted by adjusting the maximum width of the first region 111 of the mask 100 and the maximum width of the deposition portion 120 of the mask 100 can be adjusted using the reversely tapered photoresist pattern 700. In other words, the reversely tapered angle of the reversely tapered photoresist pattern 700 can be adjusted so that the size of the inlet port 150 of the mask 100 can be increased or decreased. When the inlet port 150 is formed in a small size, it may be advantageous for forming a fine pattern.

Figure 17:
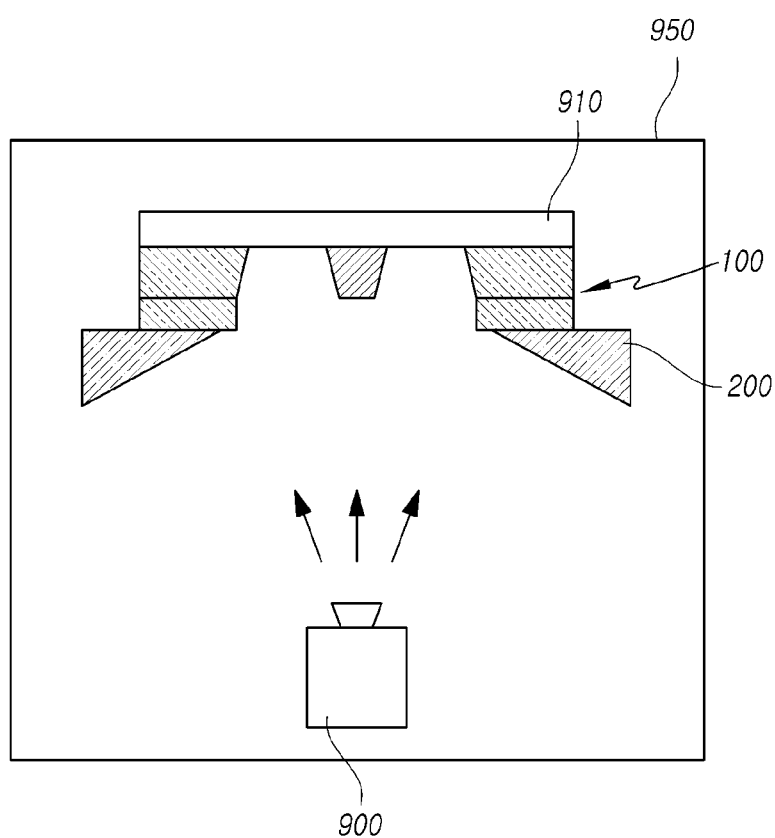
FIG. 17 is a cross-sectional view showing a deposition apparatus that is provided with a mask and a mask frame according to the present disclosure.

A process of depositing a material on a substrate (e.g., a TFT substrate or a color filter substrate) using the mask 100 and the mask frame 200 as described above will be described below. FIG. 17 is a cross-sectional view showing a deposition apparatus that is provided with a mask and a mask frame.

Referring to FIG. 17, a deposition apparatus includes a chamber 950 that provides a deposition work space for a substrate 910, a depositing material 900 installed in the chamber 950, a mask 100 disposed on one side of the substrate 910, and a mask frame 200 welded to one side of the mask 100.

Meanwhile, in order to manufacture a high-resolution display device, it is important to reduce or eliminate a shadow effect that can occur during the deposition process. This minimizes the spacing between the substrate 910 and the mask 100 that are in contact with each other so that the mask 100 shall not be floated from the substrate 910. That is, a degree of adhesion between the substrate 910 and the mask 100 should be improved.

The mask 100 according to the aspects of the present disclosure is formed in such a manner where the thickness of the boundary portion to be welded to the mask frame 200 is thicker than the thickness of the deposition portion so that the thermal deformation of the mask can be prevented during the welding, thereby preventing the mask 100 from being floated from the substrate 910.

In addition, by minimizing the thermal deformation of the mask 100 according to the aspects of the disclosure, it is possible to prevent the position of the deposition pattern portion on the mask from being changed. That is, by preventing the position of the deposition pattern portion on the mask from being changed in the deposition process using the mask 100, the deposited material can be accurately deposited on the substrate 910.

Features, structures, and effects described in the above-described exemplary aspects are included in at least one exemplary aspect of the present disclosure, but are not limited to only one exemplary aspect. Further, features, structures, and effects exemplified in each exemplary aspect may be embodied by being combined with another exemplary aspect or modified by those skilled in the art. It should be interpreted that the combined and modified contents are included in the scope of the present disclosure.

In the above description, the present disclosure has been described based on the exemplary aspects, but the exemplary aspects are for illustrative purposes, and do not limit the present disclosure, and those skilled in the art will appreciate that various modifications and applications, which are not exemplified in the above description, may be made without departing from the scope of the essential characteristic of the present exemplary aspects. For example, each component described in detail in the aspects can be modified. The differences related to such variations and applications should be construed to be included within the scope of the present disclosure as defined in the appended claims.

What is claimed is:

1. A mask for processing thin films, comprising:
a deposition portion having a plurality of deposition patterns; and
a boundary portion surrounding the deposition portion and having a first region, and a second region extending from the first region and separately formed from the first region;
a welding line provided to surround the deposition portion in the boundary portion; and
a mask frame attached to the boundary portion of the mask along the welding line,
wherein the boundary portion has a thickness greater than that of the deposition portion,
wherein the deposition patterns have a shape tapered towards an opposite surface of the deposition pattern from the mask frame, and the first region of the boundary portion has a shape tapered towards an opposite surface of the first region of the boundary portion from the mask frame, and
wherein the welding line comprises of four welding lines that respectively each run along a side of the deposition portion and are separated from one another in corners of the boundary portion, the separation of the four welding lines in the corners of the boundary portion being used when a glass substrate is disposed to cover areas corresponding to the corners of the boundary portion.

2. The mask of claim 1, wherein the first region has a thickness equal to or greater than that of the deposition portion.

3. The mask of claim 1, wherein the first region has a maximum width wider than that of the second region.

4. The mask of claim 1, wherein the mask frame is attached to a first surface of the second region.

5. The mask of claim 4, wherein the welding line is provided on a second surface of the first region.

6. The mask of claim 1, wherein the welding line includes a solid line shape or a dotted line shape.

7. A mask for processing thin films, comprising:
a deposition portion having a plurality of deposition patterns;
a boundary portion surrounding the deposition portion and having first and second regions, wherein the second region extends from the first region and is separately formed from the first region, and the boundary portion has a thickness greater than that of the deposition portion;
a welding line provided to surround the deposition portion in the boundary portion; and
a mask frame attached to a first surface of the second region along the welding line,
wherein the deposition patterns have a shape tapered towards an opposite surface of the deposition pattern from the mask frame, and the first region of the boundary portion has a shape tapered towards an opposite surface of the first region of the boundary portion from the mask frame, and
wherein the welding line comprises of four welding lines that respectively each run along a side of the deposition portion and are separated from one another in corners of the boundary portion, the separation of the four welding lines in the corners of the boundary portion being used when a glass substrate is disposed to cover areas corresponding to the corners of the boundary portion.

8. The mask of claim 7, wherein the welding line is on a second surface of the first region.

* * * * *